United States Patent
Yeh et al.

(10) Patent No.: US 10,461,146 B1
(45) Date of Patent: Oct. 29, 2019

(54) PACKAGE STRUCTURE AND MANUFACTURING METHOD THEREOF

(71) Applicant: Unimicron Technology Corp., Taoyuan (TW)

(72) Inventors: Wen-Liang Yeh, Taoyuan (TW); Chun-Hsien Chien, New Taipei (TW); Chien-Chou Chen, Hsinchu County (TW); Cheng-Hui Wu, New Taipei (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 16/151,351

(22) Filed: Oct. 4, 2018

(30) Foreign Application Priority Data

Jul. 26, 2018 (TW) .............................. 107125929 A

(51) Int. Cl.
| H01L 21/02 | (2006.01) |
| H01L 49/02 | (2006.01) |
| H01L 23/00 | (2006.01) |
| H01L 23/522 | (2006.01) |

(52) U.S. Cl.
CPC .......... *H01L 28/60* (2013.01); *H01L 23/5223* (2013.01); *H01L 24/32* (2013.01); *H01L 24/49* (2013.01); *H01L 2224/02371* (2013.01); *H01L 2924/1205* (2013.01)

(58) Field of Classification Search
CPC ..... H01L 23/5223; H01L 24/32; H01L 24/49; H01L 28/60
USPC ................................. 257/532, 207
See application file for complete search history.

(56) References Cited

U.S. PATENT DOCUMENTS

| 9,577,025 B2 | 2/2017 | Gu et al. |
| 2017/0358559 A1* | 12/2017 | Ye ................... H01L 25/0657 |

FOREIGN PATENT DOCUMENTS

| TW | I479640 B | 4/2015 |
| TW | 201642368 A | 12/2016 |
| TW | 201705442 A | 2/2017 |
| TW | I571985 B | 2/2017 |
| TW | 201732970 A | 9/2017 |
| TW | 201814858 A | 4/2018 |
| TW | I642152 B | 11/2018 |

* cited by examiner

*Primary Examiner* — Tan N Tran
(74) *Attorney, Agent, or Firm* — CKC & Partners Co., LLC

(57) ABSTRACT

A package structure includes a substrate, a metal-insulator-metal capacitor, a circuit redistribution structure, and a chip. The metal-insulator-metal capacitor is disposed over the substrate and includes a first electrode, a second electrode, and an insulating layer. The circuit redistribution structure is disposed over the metal-insulator-metal capacitor and includes a first circuit redistribution layer and a second circuit redistribution layer. The first circuit redistribution layer includes a first wire electrically connected to the first electrode and a second wire electrically connected to the second electrode. The second circuit redistribution layer is disposed on the first circuit redistribution layer and includes a third wire electrically connected to the first wire and a fourth wire electrically connected to the second wire. The chip is disposed over the circuit redistribution structure and electrically connected to the third wire and the fourth wire.

10 Claims, 6 Drawing Sheets ized by the standard capture method. The first wire electrically electrodes and insulating layer of the circuit.

PACKAGE STRUCTURE AND MANUFACTURING METHOD THEREOF

CROSS-REFERENCE TO RELATED APPLICATION

This application claims priority to Taiwan Application Serial Number 107125929, filed Jul. 26, 2018, which is herein incorporated by reference.

BACKGROUND

Field of Invention

The present disclosure relates to a package structure, and a method for manufacturing the package structure.

Description of Related Art

Conventionally, passive elements, such as capacitors, are typically welded onto a substrate upon their respective manufacturing in accordance with the circuit design. However, these passive elements generally take up a certain space (for example, a stereo capacitor), thus adversely influencing the electronic device thinning.

SUMMARY

An aspect of the present disclosure provides a package structure, including a substrate, a metal-insulator-metal capacitor, a circuit redistribution structure, and a chip. The metal-insulator-metal capacitor is disposed on the substrate, and includes a first electrode, a second electrode, and an insulating layer. The insulating layer is disposed between the first electrode and the second electrode. The circuit redistribution structure is disposed on the metal-insulator-metal capacitor. The circuit redistribution structure includes a first circuit redistribution layer and a second circuit redistribution layer. The first circuit redistribution layer includes a first wire and a second wire. The first wire is electrically connected to the first electrode. The second wire is electrically connected to the second electrode. The second circuit redistribution layer is disposed on the first circuit redistribution layer, and includes a third wire and a fourth wire. The third wire is electrically connected to the first wire. The fourth wire is electrically connected to the second wire. The chip is disposed on the circuit redistribution structure and electrically connected to the third wire and the fourth wire.

In some embodiments of the present disclosure, the package structure further includes an adhesive layer disposed between the substrate and the metal-insulator-metal capacitor.

In some embodiments of the present disclosure, a thickness of the adhesive layer is 5 μm to 15 μm.

In some embodiments of the present disclosure, the first electrode of the metal-insulator-metal capacitor has a first portion. The first portion does not overlap with the second electrode in a normal direction of the first electrode, and the first wire is electrically connected to the first electrode by contacting a first conductive contact of the first portion.

In some embodiments of the present disclosure, the package structure further includes a solder mask layer disposed between the circuit redistribution structure and the chip. The solder mask layer covers the third wire and the fourth wire, and has a first opening and a second opening respectively exposing a portion of the third wire and a portion of the fourth wire.

In some embodiments of the present disclosure, the package structure further includes a protective layer disposed between the solder mask layer and the chip.

Another aspect of the present disclosure provides a method for manufacturing the package structure, including the steps of: providing a substrate; using an adhesive material to bond a metal-insulator-metal capacitor onto the substrate, wherein the metal-insulator-metal capacitor includes a first electrode, a second electrode, and an insulating layer disposed between the first electrode and the second electrode; forming a first circuit redistribution layer on the metal-insulator-metal capacitor, wherein the first circuit redistribution layer includes a first wire electrically connected to the first electrode and a second wire electrically connected to the second electrode; forming a second circuit redistribution layer on the first circuit redistribution layer, wherein the second circuit redistribution layer includes a third wire electrically connected to the first wire and a fourth wire electrically connected to the second wire; and forming a chip on the second circuit redistribution layer, wherein the chip is electrically connected to the third wire and the fourth wire.

In some embodiments of the present disclosure, the first electrode of the metal-insulator-metal capacitor has a first portion. The first portion does not overlap with the second electrode in a normal direction of the first electrode. In addition, before the step of forming the first circuit redistribution layer, the method further includes the steps of: forming a first conductive contact, wherein the first conductive contact contacts the first portion of the first electrode, such that the first wire is electrically connected to the first electrode through the first conductive contact.

In some embodiments of the present disclosure, before the step of forming the chip, the method further includes the steps of: forming a solder mask layer on the second circuit redistribution layer, wherein the solder mask layer covers the third wire and the fourth wire, and has a first opening and a second opening exposing a portion of the third wire and a portion of the fourth wire, respectively.

In some embodiments of the present disclosure, after the step of forming the chip, the method further includes the steps of: forming a protective layer between the solder mask layer and the chip.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
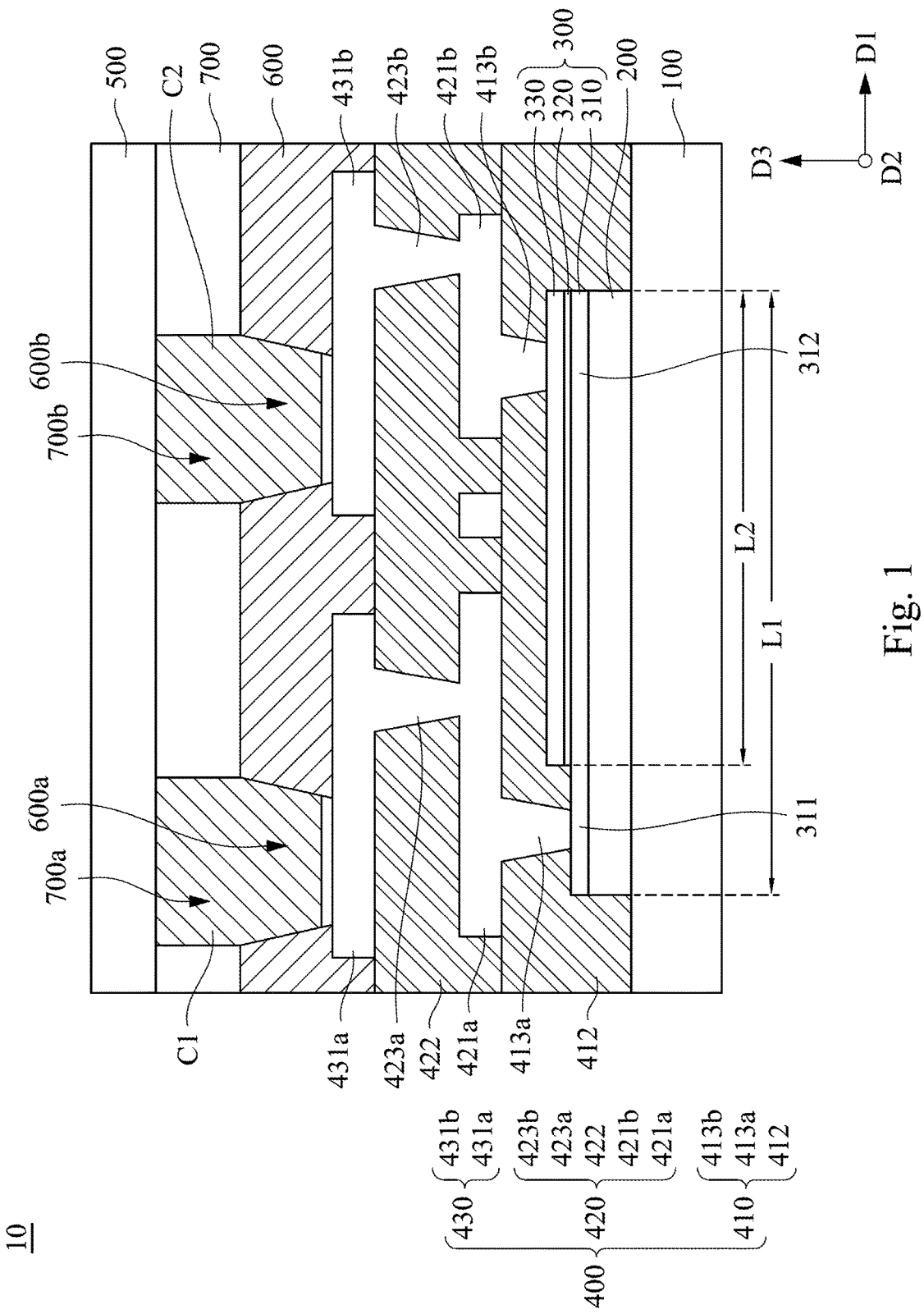
FIG. 1 is a schematic cross-sectional view of a package structure according to an embodiment of the present disclosure.

In order to make the description of the present disclosure more detailed and complete, the following illustratively describes implementation aspects and specific embodiments of the present disclosure; however, this is not the only form in which the specific embodiments of the present disclosure are implemented or utilized. The embodiments disclosed below may be combined with or substituted by each other in an advantageous manner, and other embodiments may be added to an embodiment without further recording or description. In the following description, numerous specific details will be described in detail to enable readers to fully understand the following embodiments. However, the embodiments of the present disclosure may be practiced without these specific details.

Specific embodiments of the components and arrangements described below are intended to simplify the present disclosure. Of course, these are merely embodiments and are not intended to limit the present disclosure. For example, forming a first feature above or on a second feature in the subsequent description may include an embodiment in which the first feature and the second feature are formed as in direct contact, or include an embodiment in which an additional feature is formed between the first feature and the second feature such that the first feature and the second feature are not in direct contact. Additionally, component symbols and/or letters may be repeated in various embodiments of the present disclosure. This repetition is for the purpose of simplicity and clarity, and does not in itself indicate the relationship between the various embodiments and/or configurations discussed.

Furthermore, spatial relative terms, such as "below", "under", "above", "over", etc., are intended to facilitate description of the relative relationship between a component or feature and another component or feature, as shown in the drawings. The true meaning of these spatial relative terms includes other orientations. For example, when the illustration is flipped up and down by 180 degrees, the relationship between a component and another component may change from "below" or "under" to "above" or "over". Furthermore, the spatial relative narratives used herein should be interpreted the same.

FIG. 1 depicts a schematic cross-sectional view of a package structure 10 according to an embodiment of the present disclosure. As shown in FIG. 1, the package structure 10 includes a substrate 100, an adhesive layer 200, a metal-insulator-metal (MIM) capacitor 300, a circuit redistribution structure 400, and a chip 500.

The metal-insulator-metal capacitor 300 is disposed on the substrate 100, and includes a first electrode 310, a second electrode 330, and an insulating layer 320. Specifically, the insulating layer 320 is disposed between the first electrode 310 and the second electrode 330. In some embodiments, the thickness of the first electrode 310 and the second electrode 330 ranges from 0.5 μm to 10 μm, for example, 0.6 μm, 0.8 μm, 1 μm, 2 μm, 4 μm, or 8 μm. In some embodiments, the thickness of the insulating layer 320 ranges from 0.1 μm to 5 μm, for example, 0.2 μm, 0.3 μm, 0.5 μm, 1 μm, 2 μm, or 4 μm.

In some embodiments, a length L1 of the first electrode 310 in a first direction D1 is from 0.2 mm to 75 mm. A length L2 of the second electrode 330 and the insulating layer 320 in the first direction D1 is 0.1 mm to 74.9 mm. In a direction D2 (the direction passing through the paper) perpendicular to the first direction D1, the first electrode 310, the second electrode 330, and the insulating layer 320 have a same width, for example, 0.4 mm to 75 mm.

Specifically, the first electrode 310 has a first portion 311 and a second portion 312. In a normal direction of the first electrode 310 (i.e., a third direction D3 perpendicular to the first direction D1), the first portion 311 does not overlap the second electrode 330, while the second portion 312 overlaps the second electrode 330.

In some embodiments, the first electrode 310 and the second electrode 330 include but not limited to platinum (Pt), titanium nitride (TiN), gold (Au), titanium (Ti), tantalum (Ta), tantalum nitride (TaN), tungsten (W), tungsten nitride (WN), or copper (Cu), or the like. In some embodiments, the insulating layer 320 includes but not limited to nickel oxide (NiO), titanium oxide (TiO), hafnium oxide (HfO), zirconium oxide (ZrO), zinc oxide (ZnO), tungsten oxide ($WO_3$), alumina ($Al_2O_3$), tantalum oxide (TaO), molybdenum oxide (MoO), copper oxide (CuO), or the like. It should be noted that although the insulating layer 320 depicted in FIG. 1 is monolayer, the insulating layer 320 in other embodiments may be multiplayer stacked on each other.

An adhesive layer 200 is disposed between the substrate 100 and the metal-insulator-metal capacitor 300. The adhesive layer 200 is used for bonding the substrate 100 and the metal-insulator-metal capacitor 300. In some embodiments, a thickness of the adhesive layer 200 ranges from 5 μm to 15 μm, for example, 6 μm, 8 μm, 10 μm, or 12 μm. When the thickness of the adhesive layer 200 is less than 5 μm, the adhesive strength between the substrate 100 and the metal-insulator-metal capacitor 300 is insufficient. However, the thickness of the adhesive layer 200 greater than 15 μm does not satisfy the development trend of the electronic device thinning. In some embodiments, the adhesive layer 200 includes but not limited to silica gel, epoxy resin gel, polyimide (PI) gel, or polyethylene terephthalate (PET) gel.

A circuit redistribution structure 400 is disposed on the metal-insulator-metal capacitor 300. Specifically, the circuit redistribution structure 400 includes an interlayer dielectric layer 410, a first circuit redistribution layer 420, and a second circuit redistribution layer 430.

The interlayer dielectric layer 410 includes a first dielectric layer 412, a first conductive contact 413a, and a second conductive contact 413b. Specifically, the first dielectric layer 412 covers the metal-insulator-metal capacitor 300. The first conductive contact 413a and the second conductive contact 413b are embedded in the first dielectric layer 412. Specifically, a bottom of the first conductive contact 413a contacts the first portion 311 of the first electrode 310, and an upper surface of the first conductive contact 413a is exposed out of the first dielectric layer 412. A bottom of the second conductive contact 413b contacts the second electrode 330, and an upper surface of the second conductive contact 413b is exposed out of the first dielectric layer 412.

The first circuit redistribution layer 420 is disposed on the interlayer dielectric layer 410. The first circuit redistribution layer 420 includes a first wire 421a, a second wire 421b, a second dielectric layer 422, a third conductive contact 423a, and a fourth conductive contact 423b. Specifically, the first wire 421a and the second wire 421b are disposed on the first dielectric layer 412. The first wire 421a contacts an exposed portion of the first conductive contact 413a, and the second wire 421b contacts an exposed portion of the second conductive contact 413b, such that the first wire 421a is electrically connected to the first electrode 310, and the second wire 421b is electrically connected to the second electrode 330. The second dielectric layer 422 covers the first wire 421a, the second wire 421b, and the first dielectric layer 412. The third conductive contact 423a and the fourth conductive contact 423b are embedded in the second dielectric layer 422. Specifically, a bottom of the third conductive contact 423a contacts a portion of the first wire 421a, and an upper surface of the third conductive contact 423a is exposed out of the second dielectric layer 422. A bottom of the fourth conductive contact 423b contacts the second wire 421b, and an upper surface of the fourth conductive contact 423b is exposed out of the second dielectric layer 422.

The second circuit redistribution layer 430 is disposed on the first circuit redistribution layer 420 and the second circuit redistribution layer 430 includes a third wire 431a and a fourth wire 431b. Specifically, the third wire 431a and the fourth wire 431b are disposed on the second dielectric layer 422. The third wire 431a contacts an exposed portion of the third conductive contact 423a, and the fourth wire 431b contacts an exposed portion of the fourth conductive contact 423b, such that the third wire 431a is electrically connected to the first wire 421a, and the fourth wire 431b is electrically connected to the second wire 421b.

As shown in FIG. 1, the widths of the first conductive contact 413a, the second conductive contact 413b, the third conductive contact 423a, and the fourth conductive contact 423b are gradually tapered from top to bottom to form trapezoidal shapes, each having a wide top and a narrow bottom. However, the shape of the first conductive contact 413a, the second conductive contact 413b, the third conductive contact 423a, and the fourth conductive contact 423b are not limited thereto. For example, the first conductive contact 413a, the second conductive contact 413b, the third conductive contact 423a, and the fourth conductive contact 423b may be cylindrical, cubic, and the like. In some embodiments, the first wire 421a, the second wire 421b, the third wire 431a, and the fourth wire 431b include but not limited to any conductive materials, for example, copper, nickel, silver, or the like. In some embodiments, the first dielectric layer 412 and the second dielectric layer 422 include but not limited to ABF (Ajinomoto Build-up Film), polyimide (PI), or photoimageable dielectric (PID) materials. In some embodiments, the first conductive contact 413a, the second conductive contact 413b, the third conductive contact 423a, and the fourth conductive contact 423b may be metal pillars which include but not limited to, for example, copper, nickel, or silver, and other conductive metals.

A chip 500 is disposed on the circuit redistribution structure 400, and electrically connected to the third wire 431a and the fourth wire 431b. Specifically, a first metal bump and a second metal bump (not shown) are disposed at a bottom surface of the chip 500. The first metal bump is bonded to the third wire 431a through a first welding material C1 such that the chip 500 is electrically connected to the third wire 431a. Similarly, the second metal bump is bonded to the fourth wire 431b through a second welding material C2 such that the chip 500 is electrically connected to the fourth wire 431b. In some embodiments, the first welding material C1 and the second welding material C2 include but not limited to solder balls.

In some embodiments, the package structure 10 further includes a solder mask layer 600. As shown in FIG. 1, the solder mask layer 600 is disposed between the circuit redistribution structure 400 and the chip 500. Specifically, the solder mask layer 600 covers the third wire 431a and the fourth wire 431b, and the solder mask layer 600 has a first opening 600a and a second opening 600b. The first opening 600a and the second opening 600b expose a portion of the third wire 431a and a portion of the fourth wire 431b, respectively. A bottom of the first welding material C1 fills the first opening 600a and bonds to the exposed portion of the third wire 431a. A bottom of the second welding material C2 fills the second opening 600b and bonds to the exposed portion of the fourth wire 431b. In some embodiments, the solder mask layer 600 includes solder resist or solder mask.

In some embodiments, the package structure 10 further includes a protective layer 700. The protective layer 700 is disposed between the solder mask layer 600 and the chip 500. Specifically, the protective layer 700 has a third opening 700a in communication with the first opening 600a, and a fourth opening 700b in communication with the second opening 600b. A top of the first welding material C1 fills the third opening 700a, and a top of the second welding material C2 fills the fourth opening 700b. In some embodiments, the protective layer 700 includes but not limited to resin. It is noted that the protective layer 700 may protect the bonding of a metal bump of the chip 500 with the third wire 431a and the fourth wire 431b so as to avoid peeling. On the other hand, the protective layer 700 may also block steam and avoid oxidation of the metal bump, the first welding material C1, the second welding material C2, the third wire 431a, and the fourth wire 431b.

The present disclosure also provides a method for manufacturing the package structure 10. FIGS. 2 to 8 depict schematic cross-sectional views showing different stages of a manufacturing method of the package structure according to an embodiment of the present disclosure.

Figure 2:
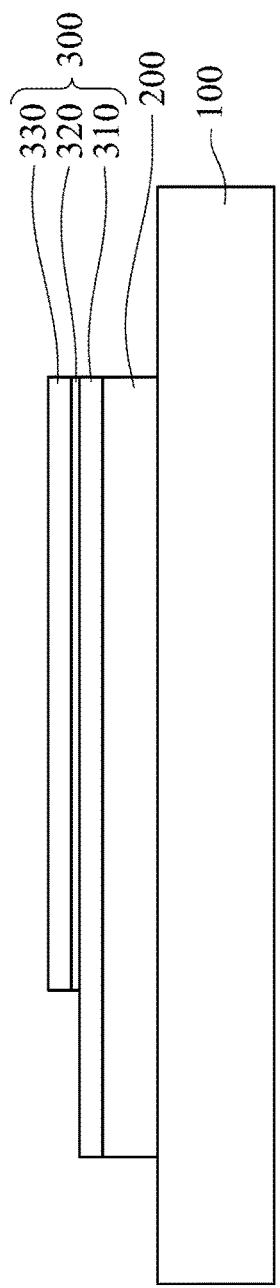
FIGS. 2 to 8 are schematic cross-sectional views depicting different stages of a method for manufacturing the package structure according to an embodiment of the present disclosure.

As shown in FIG. 2, an adhesive layer 200 and a metal-insulator-metal capacitor 300 are formed on a substrate 100. Specifically, the metal-insulator-metal capacitor 300 is bonded to the substrate 100 by an adhesive material.

Figure 3:
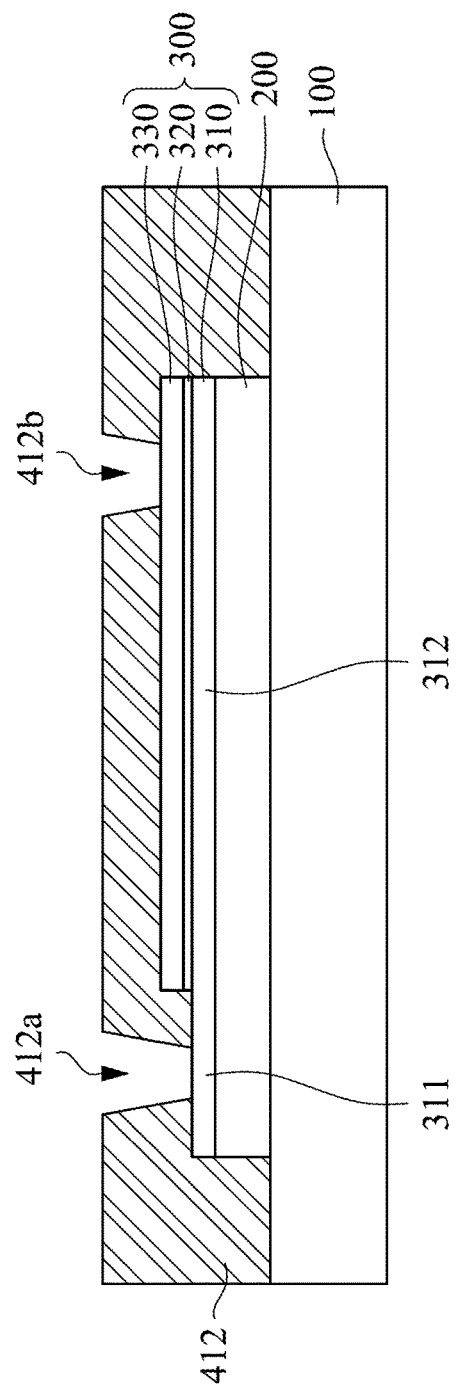

Next, as shown in FIG. 3, a first dielectric layer 412 is formed, and covers the metal-insulator-metal capacitor 300 and the substrate 100. Specifically, the first dielectric layer 412 includes a first via 412a exposing first portion 311 of a first electrode 310 and a second via 412b exposing a second electrode 330. For example, a dielectric material is formed to cover the metal-insulator-metal capacitor 300 and the substrate 100, and the dielectric material is patterned to form a first via 412a and a second via 412b. In some embodiments, the method of forming the dielectric material includes but not limited to chemical vapor deposition, physical vapor deposition, or the like. In some embodiments, the method of patterning the dielectric material includes depositing a photoresist on the layer to be patterned, and forming the patterned photoresist layer through exposure and development. Then, this patterned photoresist layer is used as an etching mask to etch the layer to be patterned. Finally, the patterned photoresist layer is removed. Alternatively, in an embodiment where the dielectric material is a photo-sensitive dielectric material, the patterning can be achieved by the exposure and development to remove a part of the photo-sensitive dielectric material.

Figure 4:
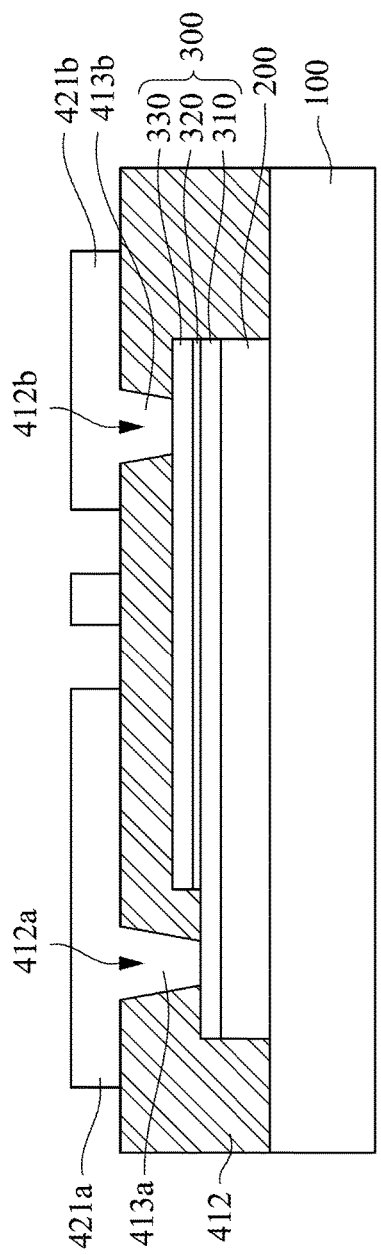

Next, as shown in FIG. 4, a first wire 421a and a second wire 421b are formed on the first dielectric layer 412, and a first conductive contact 413a and a second conductive contact 413b are formed respectively in the first via 412a and the second via 412b. For example, a conductive material is formed on the first dielectric layer 412, and fills the first via 412a and the second via 412b. Then, the conductive material is patterned to form a first wire 421a, a second wire 421b, a first conductive contact 413a, and a second conductive contact 413b. In some embodiments, the method of forming the conductive material includes but not limited to electroplating, chemical vapor deposition, physical vapor deposition, or the like.

Figure 5:
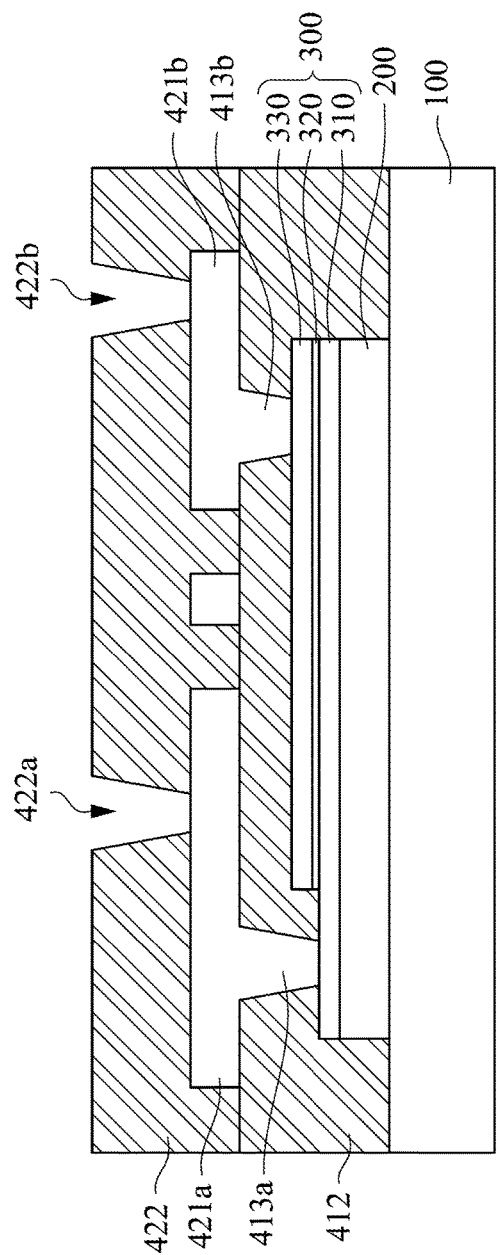

Next, as shown in FIG. 5, a second dielectric layer 422 is formed to cover the first wire 421a, the second wire 421b, and the first dielectric layer 412. The second dielectric layer 422 includes a third via 422a and a forth via 422b which, respectively, expose a first wire 421a and a second wire 421b. For example, a dielectric material is formed to cover the first wire 421a, the second wire 421b, and the first dielectric layer 412, and the dielectric material is patterned to form a third via 422a and a forth via 422b. It should be noted that the methods of forming and patterning the dielectric material described above will not be repeated hereinafter.

Figure 6:
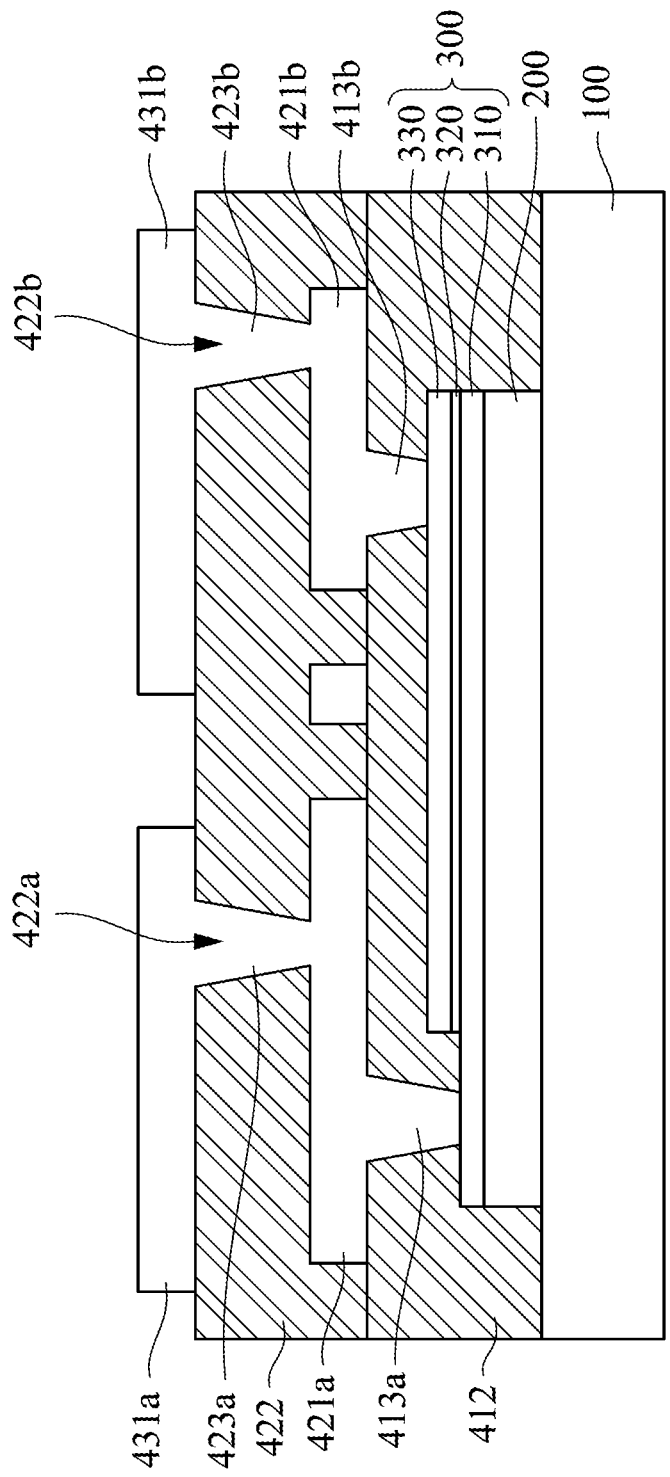

Next, as shown in FIG. 6, a third wire 431a and a fourth wire 431b are formed on the second dielectric layer 422, and a third conductive contact 423a and a fourth conductive contact 423b are respectively formed in the third via 422a and the forth via 422b. For example, a conductive material is formed on the second dielectric layer 422 and fills the third via 422a and the forth via 422b. Then, the conductive material is patterned to form a third wire 431a, a fourth wire 431b, a third conductive contact 423a, and a fourth conductive contact 423b. The method of forming the conductive material described above will not be repeated hereinafter.

Figure 7:
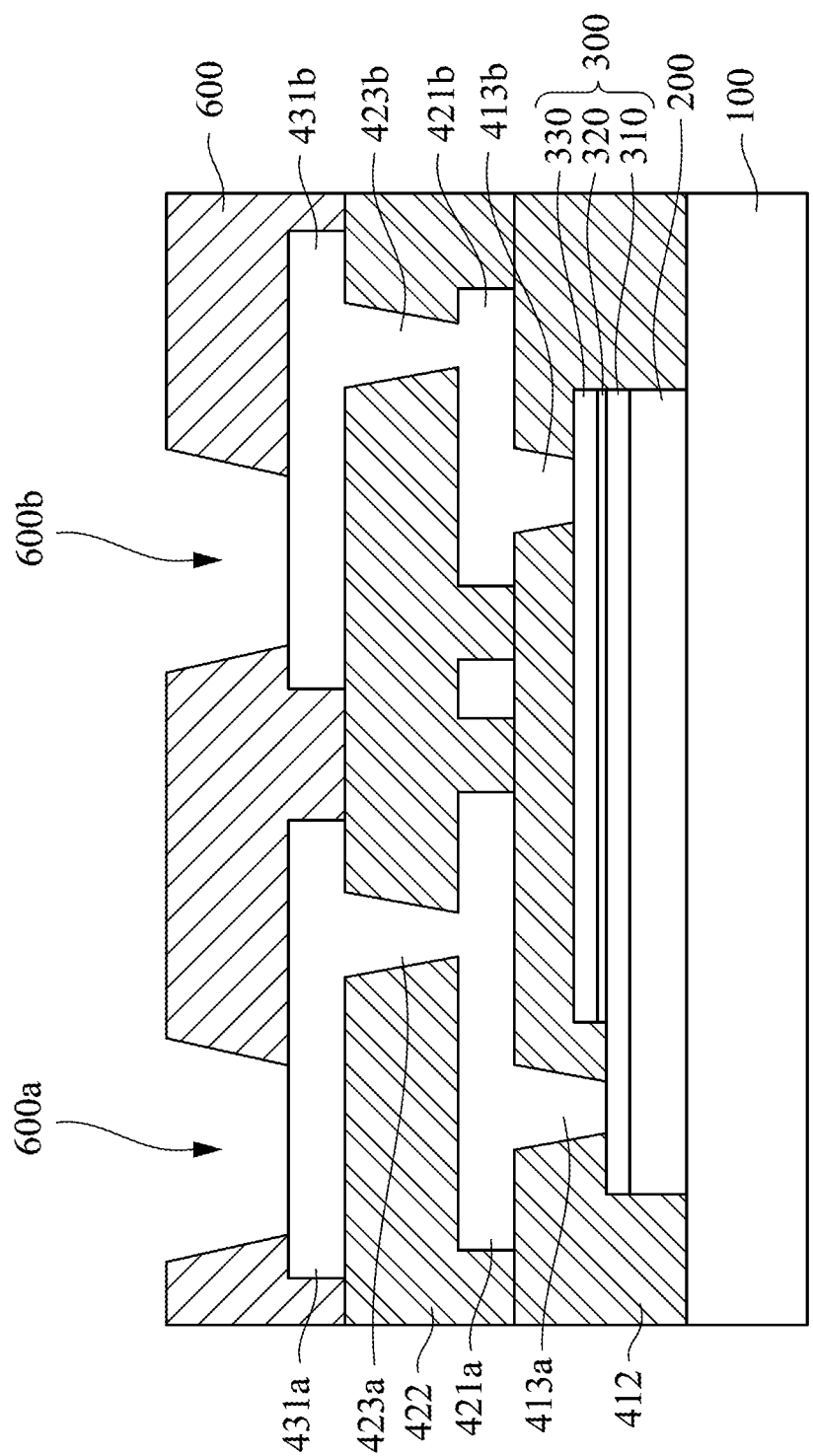

Next, as shown in FIG. 7, a solder mask layer 600 is formed to cover the third wire 431a, the fourth wire 431b, and the second dielectric layer 422. The solder mask layer 600 includes a first opening 600a and a second opening 600b which, respectively, expose a portion of the third wire 431a and a portion of the fourth wire 431b.

Figure 8:
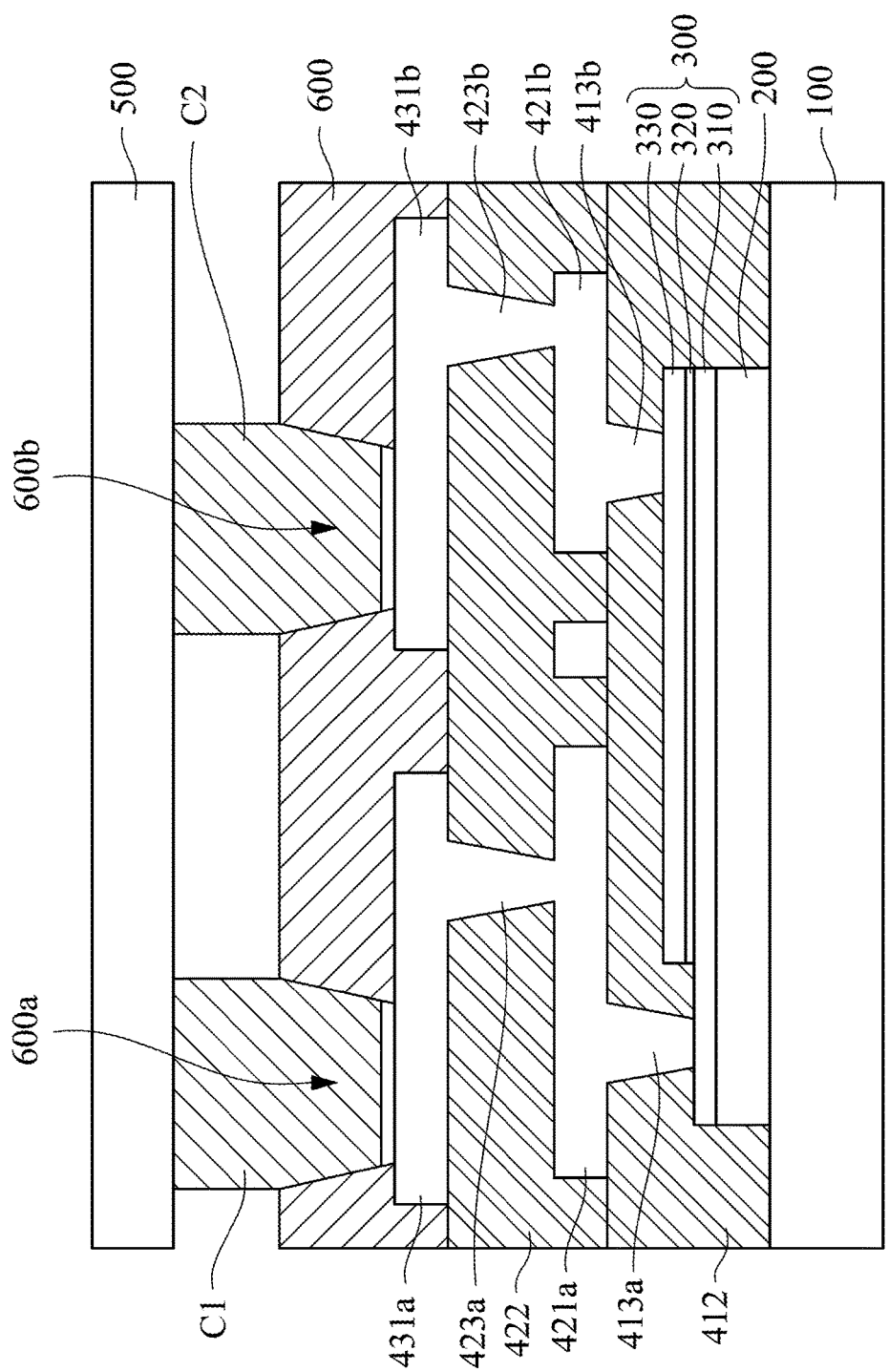

Next, as shown in FIG. 8, the chip 500 is disposed on the solder mask layer 600, and the chip 500 is electrically connected to the third wire 431a and the fourth wire 431b. Specifically, the first welding material C1 is used to bond a first metal bump (not shown) disposed at a bottom surface of the chip 500 with the third wire 431a. The bottom of the first welding material C1 fills the first opening 600a and bonds to an exposed portion of the third wire 431a, such that the chip 500 is electrically connected to the third wire 431a. The second welding material C2 is used to bond a second metal bump (not shown) disposed at the bottom surface of the chip 500 with the fourth wire 431b. The bottom of the second welding material C2 fills the second opening 600b and bonds to an exposed portion of the fourth wire 431b, such that the chip 500 is electrically connected to the fourth wire 431b.

Next, the protective layer 700 is formed between the solder mask layer 600 and the chip 500, thus forming the package structure 10 as shown in FIG. 1. For example, a dielectric material fills between the solder mask layer 600 and the chip 500 to form the protective layer 700.

From the above embodiments, it can be known that in the package structure disclosed herein, metal-insulator-metal capacitor is used to substitute the traditional stereo capacitor. In addition, the metal-insulator-metal capacitor is embedded in the dielectric layer, hence it facilitates the electronic device thinning.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A package structure, comprising:
   a substrate;
   a metal-insulator-metal capacitor disposed on the substrate, comprising a first electrode, a second electrode, and an insulating layer, wherein the insulating layer is disposed between the first electrode and the second electrode;
   a circuit redistribution structure disposed on the metal-insulator-metal capacitor, wherein the circuit redistribution structure comprises:
      a first circuit redistribution layer, comprising a first wire and a second wire, wherein the first wire is electrically connected to the first electrode, and the second wire is electrically connected to the second electrode; and
      a second circuit redistribution layer disposed on the first circuit redistribution layer, comprising a third wire and a fourth wire, wherein the third wire is electrically connected to the first wire, and the fourth wire is electrically connected to the second wire; and
   a chip disposed on the circuit redistribution structure and electrically connected to the third wire and the fourth wire.

2. The package structure of claim 1, further comprising an adhesive layer disposed between the substrate and the metal-insulator-metal capacitor.

3. The package structure of claim 2, wherein a thickness of the adhesive layer is from 5 μm to 15 μm.

4. The package structure of claim 1, wherein the first electrode of the metal-insulator-metal capacitor has a first portion, the first portion does not overlap with the second electrode in a normal direction of the first electrode, and the first wire is electrically connected to the first electrode by contacting a first conductive contact of the first portion.

5. The package structure of claim 1, further comprising a solder mask layer disposed between the circuit redistribution structure and the chip, wherein the solder mask layer covers the third wire and the fourth wire, and has a first opening and a second opening respectively exposing a portion of the third wire and a portion of the fourth wire.

6. The package structure of claim 5, further comprising a protective layer disposed between the solder mask layer and the chip.

7. A method for manufacturing a package structure, comprising:
   providing a substrate;
   using an adhesive material to bond a metal-insulator-metal capacitor onto the substrate, wherein the metal-insulator-metal capacitor comprises a first electrode, a second electrode, and an insulating layer disposed between the first electrode and the second electrode;
   forming a first circuit redistribution layer on the metal-insulator-metal capacitor, wherein the first circuit redistribution layer comprises a first wire electrically connected to the first electrode and a second wire electrically connected to the second electrode;
   forming a second circuit redistribution layer on the first circuit redistribution layer, wherein the second circuit redistribution layer comprises a third wire electrically connected to the first wire and a fourth wire electrically connected to the second wire; and
   forming a chip on the second circuit redistribution layer, wherein the chip is electrically connected to the third wire and the fourth wire.

8. The method for manufacturing the package structure of claim 7, wherein the first electrode of the metal-insulator-metal capacitor has a first portion, the first portion does not overlap the second electrode in a normal direction of the first electrode, and before the step of forming the first circuit redistribution layer, the method further comprises:

forming a first conductive contact, wherein the first conductive contact contacts the first portion of the first electrode, thus the first wire is electrically connected to the first electrode through the first conductive contact.

9. The method for manufacturing the package structure of claim 7, wherein before the step of forming the chip, the method further comprises:

forming a solder mask layer on the second circuit redistribution layer, wherein the solder mask layer covers the third wire and the fourth wire and the solder mask layer has a first opening and a second opening respectively exposing a portion of the third wire and a portion of the fourth wire.

10. The method for manufacturing the package structure of claim 9, wherein after the step of forming the chip, the method further comprises:

forming a protective layer between the solder mask layer and the chip.

\* \* \* \* \*